United States Patent [19]
Kennedy

[11] Patent Number: 4,672,671
[45] Date of Patent: Jun. 9, 1987

[54] AUDIO FREQUENCY SIGNAL PREAMPLIFIER FOR PROVIDING CONTROLLED OUTPUT SIGNALS

[75] Inventor: Bruce L. Kennedy, Santa Barbara, Calif.

[73] Assignee: Carter Duncan Corporation, Santa Barbara, Calif.

[21] Appl. No.: 677,225

[22] Filed: Dec. 3, 1984

[51] Int. Cl.$^4$ .............................................. H03G 3/00
[52] U.S. Cl. ............................... 381/61; 84/DIG. 26; 84/DIG. 9; 381/118; 381/119; 381/98; 381/63
[58] Field of Search ...................... 381/61, 62, 98, 101, 381/118, 119, 63; 84/1.16, 1.19, DIG. 9

[56] References Cited

U.S. PATENT DOCUMENTS

| | | | |
|---|---|---|---|
| 2,315,248 | 3/1943 | de Rosa | 381/98 |
| 3,663,735 | 5/1972 | Evans | 84/1.16 |
| 3,973,461 | 8/1976 | Jahns | 84/1.24 |
| 4,211,893 | 7/1980 | Smith | 381/118 |
| 4,481,661 | 11/1984 | Spector | 381/61 |

OTHER PUBLICATIONS

Ibanez UE-400, Multi Effects Service Manual, 1980.
TUSC Tube Amplifiers sales brochure captioned, "Thanks for the Memory", relating to TUSC Introduces the World's First 2 Channel Amp with a Built-In Pre-Programmable Memory, distributed by TUSC International Sales Office, 3 Oval Drive, Central Islip, New York 11722.

*Primary Examiner*—Forester W. Isen
*Attorney, Agent, or Firm*—Daniel J. Meaney, Jr.

[57] ABSTRACT

A preamplifier adapted to receive audio frequency electrical signals generated by a musical instrument for providing controlled output signals therefrom having selected distortion and harmonic signal content is shown wherein the preamplifier includes an amplifier for amplifying audio frequency electrical signals generated by the musical instrument, a first electrical signal processing channel operatively coupled to the amplifier for receiving the amplified audio frequency electrical signals and for producing in response thereto a first controlled output signal wherein the first electrical signal processing channel includes a plurality of selectively interconnectable signal processing circuits at least one of which is capable of at least one of selectively amplifying, distorting and adding preselected harmonic content to the first controlled output signal, a second electrical processing channel operatively coupled to the amplifier for receiving the amplified audio electrical signals and for producing response thereto a second controlled output signal and wherein the second electrical processing channel includes a plurality of selectively interconnectable signal processing means at least one of which is capable of at least one of selectively amplifying, distorting and adding preselected harmonic content to the second controlled amplitude output signal and an output circuit operatively coupled to the first and second electrical signal processing channels for selectively applying one of the first and second controlled output signals to an output terminal is shown. A method for providing controlled output signals having selected distortion and harmonic signal content is also shown.

25 Claims, 15 Drawing Figures

AUDIO FREQUENCY SIGNAL PREAMPLIFIER FOR PROVIDING CONTROLLED OUTPUT SIGNALS

BACKGROUND OF THE INVENTION

1. Field of the Invention

This invention relates to an electronic amplification system for musical instruments and, more particularly, relates to a preamplifier adapted for receiving audio frequency electrical signals generated by a musical instrument and for providing controlled output signals therefrom having selected distortion and harmonics signal content.

2. Description of the Prior Art

It is known in the art to utilize performance amplifiers in connection with musical instruments, such as electrical guitar, wherein the output thereof has its amplitude, frequency and harmonic distortion modified by the amplifier prior to application of the modified electrical signals to an output device. In the state-of-the-art musical instrument performance amplifiers, the amplifiers traditionally used solid-state devices, such as NPN transistors or PNP transistors, field effect transistors, and the like.

Other known musical instrument performance amplifiers utilize vacuum tubes as the active elements. One such tube-type amplifier is offered for sale and sold under the trademark TUSC, and one of the series is identified as the "Prestige Series" programmable tube-type amplifiers. The TUSC tube-type amplifier utilizes a single channel which is adapted to be programmable to have two different operating characteristics such that it simulates a two-channel system. The TUSC tube-type amplifier includes a programmable memory which contains memory means for providing a first preprogrammed set of settings which can utilize the channel as a programmable A channel and wherein the settings on the single amplifier can be changed to a second preprogrammed setting forming a second channel, or program B channel. The programmable memory feature permits programmable overdrive and parametric equalization settings which permit the user to obtain a wider range of tonal possibilities.

U.S. Pat. No. 3,663,735 discloses an arrangement employing two channels and ganged switching devices at the output of each of a pair of channels. One channel includes a means for producing a particular amount of distortion and the other produces a clean, undistorted version of the signal. The switching device in U.S. Pat. No. 3,663,735 employs ganged switching devices at the output of each of a pair of channels under control of a moving foot switch for choosing one channel or the other channel. This arrangement requires relatively complex circuitry and simultaneous control of several switches.

U.S. Pat. No. 3,973,461 discloses a distortion control circuit which includes an input terminal which is fed to a two-terminal system having a distortion channel which includes a distortion circuit and a second channel designated as a clean channel wherein the output of both the distortion channel and the clean channel output signals are concurrently applied across a variable resistor. In this arrangement, the distortion channel provides an output that is in phase with the input thereto, whereby the signals in the two channels will not cancel regardless of the position of the adjustable resistor. In this arrangement, under control of an off-on signal, the distortion channel can be shut off, permitting the signals of the clean channel only to be applied across the variable resistor. When the switch position is changed, the distortion channel is then switched into the circuit and in parallel circuit relationship to the clean channel. This results in an output signal being produced which is a combination of the signals produced by the distortion channel and transmitted by the clean channel across the variable resistor. In the distortion control circuit disclosed in U.S. Pat. No. 3,973,461, either one or both channels are operative to produce either a clean signal or a clean signal having distortion.

U.S. Pat. No. 4,211,893 discloses a dual-mode musical instrument wherein a single-channel amplifying apparatus includes a final output stage which can be switched into the circuit or switched out of the circuit, depending on the type of musical signal desired by the operator. Specifically, the last output stage is operated such that large amplitude input signals having both positive and negative excursions drive the tube to operate in the nonlinear portions of its characteristics, resulting in an output of distorted signals having both even and odd harmonics. Also, U.S. Pat. No. 4,211,893 discloses that some preceding stages, which are essentially stages of amplification, can either be dual-triode electronic tubes or field effect transistors directly interchangeable with the vacuum tubes. Also, the overdrive saturation principles in the dual-mode musical instrument amplifier can likewise be obtained by any combination of vacuum tubes, field effect transistors or bipolar transistors.

U.S Pat. No. 2,315,248 discloses an amplification system which is adapted to provide a pseudo-extension of the frequency band of the output signals generated by the amplifier. U.S. Pat. No. 2,315,248 discloses the concept of utilizing two channels, having two amplifiers and two input microphones which are responsive to selected frequency ranges, and the outputs of each of the two channels are then combined by means of a mixing tube which produces an output signal which is a composite of the signals passed by the two separate channels. The amplifier of U.S. Pat. No. 2,315,248 modifies and distorts the tonal quality of audio frequency signals generated by a musical instrument by overdriving the electronic discharge device of one of the stages of the amplifier and providing a nonlinear output.

The operation of triode tubes, pentode tubes, and the like, in amplifiers adapted for Class A, Class AB, Class B and Class C operation are disclosed in a number of references, one of which is the *Radio Amateur's Handbook* by the Headquarters Staff of the American Radio Relay League of Newington, Conn. 06111, U.S.A., as set forth in the 45th Edition dated 1968. The *Radio Amateur's Handbook* includes a detailed discussion of the method for biasing tubes for linear and nonlinear operation, the operation of various types of solid-state devices including field effect transistors and insulated gate field effect transistors. In addition, circuit diagrams, base tube diagrams and a description of miniature receiving tube characteristics are likewise set forth in the *Radio Amateur's Handbook*.

SUMMARY OF THE PRESENT INVENTION

The present invention provides a new, novel and unique preamplifier which is adapted to receive audio frequency electrical signals generated by a musical instrument wherein the preamplifier produces controlled output signals therefrom having selected distortion and harmonic signal content. In the preferred embodiment, the preamplifier comprises means adapted to selectively amplify the audio frequency electrical signals generated by a musical instrument. The preamplifier further includes at least two electrical signal processing channels, each being capable of receiving from the amplifying means the selectively amplified audio frequency electrical signal, for producing a response thereto first and second controlled output signals. Each of the electrical signal processing channels includes a plurality of selectively interconnectable signal processing means at least one of which is capable of at least one of selectively amplifying, distorting and adding preselected harmonic content to the first and second controlled output signals. The preamplifier further includes means, including a preamplifier output terminal which is operatively coupled to the first and second electrical signal processing channels, for selectively applying one of said first and second controlled output signals to the preamplifier output terminal.

In the preferred embodiment of the invention, the preamplifier comprises a housing which includes means for defining a surface having an elongated opening formed therein. The preamplifier includes an electronic circuit means which includes a circuit means having a printed circuit means positioned within said housing and located below the elongated opening. The circuit means is adapted to define electrically conducted paths formed in a predetermined pattern and first and second electrical signal processing channels, each of which is capable of receiving and producing, in response to selectively amplified audio frequency electrical signals, first and second controlled output signals. The electronic circuit means further includes a plurality of means adapted to receive interconnectable signal processing means which are located on the printed circuit means. Each of the interconnectable signal processing means are electrically operatively connected to the circuit means and to the first and second electrical signal processing channels. At least two interconnectable signal processing means are adapted to be passed through the elongated opening of the housing surface and inserted into one of the plurality of connecting means and electrically connected such that at least one of the two interconnectable signal processing means are operatively coupled to one of the first and second electrical signal processing channels. The two interconnectable signal processing means include electronic means for at least one of selectively amplifying, distorting and adding preselected harmonic content to the first and second controlled amplitude output signal. The preamplifier further includes means, including a preamplifier output terminal operatively coupled to the circuit means, for selectively applying one of the first and second controlled output signals to the preamplifier output terminal.

The signals appearing on the preamplifier output terminal can be utilized as input terminals to a standard amplification system or to a specially designed amplification system.

The TUSC preprogrammable memory utilizes a single preamplifier channel wherein the elements within the channel are programmed so that the values thereof can be changed, based upon information stored in the memory, by a switching means. The TUSC tube-type amplifier with preprogrammable memory includes means for programmable overdrive and parametric equalization settings to allow for a wider range of total possibilities.

U.S. Pat. No. 3,663,735 utilizes a rockable foot switch to control a complex switching circuit to switch between one element having one circuit which produces a particular amount of distortion from an input signal and a clear channel. The characteristics of each channel are fixed.

The distortion control circuit of U.S. Pat. No. 3,973,461 utilizes two parallel channels which are electrically connected such that either one channel or both channels must be electrically connected into the circuit. The distortion control circuit includes means for turning the distortion on and off, enabling only a single signal processing channel to apply an output signal to the preamplifier output terminal. When both channels are in operation, an output variable resistor receives output signals from each of the channels and produces an output which is a mixture of the two signals.

U.S. Pat. No. 2,315,248 utilizes two parallel electrical signal processing channels, the outputs of which are combined together by a mixing tube to produce an output signal. One of the two signal processing circuits is capable of introducing complex electrical signals wherein the frequency and phase modulation thereof is complex.

U.S. Pat. No. 4,211,893 discloses a single-channel, dual-mode musical instrument amplifier wherein the final output stage can be switched into or out of the circuit to provide output signals which, when the circuit is electrically connected into the preamplifier circuit, results in large amplitude signals which are developed due to operation of the single output stage in the nonlinear portion of its characteristics to produce even and odd harmonics.

The above electrical amplifiers as characterized by the above-described prior art do not provide the performer the means of selecting output of a first channel and a second channel, which channels have interchangeable signal processing modules to selectively produce a first controlled electrical signal and a second controlled electrical signal from either one of the two channels. The prior art electrical amplifiers disclose that the characteristics of a single channel can be changed, either manually or under programmed control, to produce output signals having differenct characteristics. In prior art amplifiers having two channels, the output of one channel can have the electrical characteristics thereof varied, and the varied signal is electrically mixed with a clean signal to produce an output signal which is a composite of the electrical signals processed by both the first channel and the second channel.

One of the primary disadvantages of the prior art devices is the inability of a user to selectively choose between two electrical signal processing preamplifier channels, each of which have interchangeable signal processing means to produce discrete types of output signals having selected characteristics, and to produce at the output terminal of the preamplifier an output signal which is derived from one of the pluralities of such electrical signal processing channels.

Thus, one advantage of the present invention is that the user, by actuating a switching means, can immediately switch the preamplifier channel from a first channel to a second channel to abruptly and significantly vary the output characteristics of the preamplifier output signal without varying individual, discrete components, adjustable resistors, or the like.

A yet further advantage of the present invention is that an amplifier can include a housing having an elongated opening on the top surface thereof such that pluggable modules can be inserted into and removed from a printed circuit board located within the interior of the housing and wherein each of the pluggable modules is capable of at least one of amplifying, distorting and adding a preselected harmonic content to signals processed by the stages into which the pluggable modules are interconnected.

A yet further advantage of the present invention is that the housing can include a control panel which has externally extending control members which extend from the printed circuit board exterior to the housing such that the user can preset various values on the printed circuit board for each of the independent, separate channels and such that those values will remain at the preestablished settings while permitting the user to selectively switch between any one of the plurality of output channels such that any one of the pluralities of electrical signal processing channels can be selected and can have its electrical signal characteristics selected by insertion of the pluggable modules into the printed circuit board.

A yet further advantage of the present invention is that the pluggable module members can be formed of vacuum tubes, solid-state devices, or a combination thereof.

A yet further advantage of the present invention is that the preamplifier printed circuit board can be fabricated to have an input stage which is adapted to receive a pluggable module and two separate, parallel electrical signal processing channels, each of which is electrically connected to the output of the input stage and wherein the switching means operates to electrically connect the output of a selected one of the electrical signal processing channels to the output terminal such that the electrical signal having the predetermined characteristic can be selected by the user as an input to an amplifier.

A yet further advantage of the present invention is that the preamplifier produces electrical output signals which can be utilized as an input to either a standard type of amplifier or a custom-designed amplifier having controlled power input levels.

A yet further advantage of the present invention is that the amplifier control panel can include means for varying the input impedance, which allows use of low and high-impedance active pickups and low-impedance pickups to piezo high-impedance pickups.

A yet further advantage of the present invention is that the circuit means, which incorporates the first and second electrical signal processing channels, includes means for controlling the amount of overdrive such that the externally located controls on the control panel can be rotated in a first direction to decrease distortion and in a second direction to increase distortion.

A yet further advantage of the present invention is that the circuit means, which includes the first and second electrical signal processing channels, further includes variable control means which controls the preamplifier output level such that the output level of the electrical signal appearing at the terminal can be selectively controlled and will contain the selected signal characteristics independent of the level of volume.

A yet further advantage of the present invention is that the amplifier can include means for indicating which channel is in operation. In the preferred embodiment, the amplifier can utilize a colored light system such as red light being channel A and green light being channel B. The switching means can utilize a wide variety of means such as a foot control, remote actuating means, and the like.

A still further advantage of the present invention is that the preamplifier circuit can include auxiliary circuits which provide a wide variety of tonals such as reverberation, wah-wah, tremolo, fuzz and distortion.

BRIEF DESCRIPTION OF THE DRAWING

These and other advantages of the present invention will become apparent when considered in light of the detailed description of the preferred embodiment hereinbelow, which includes the following figures.

DESCRIPTION OF THE PREFERRED EMBODIMENT

Figure 1:
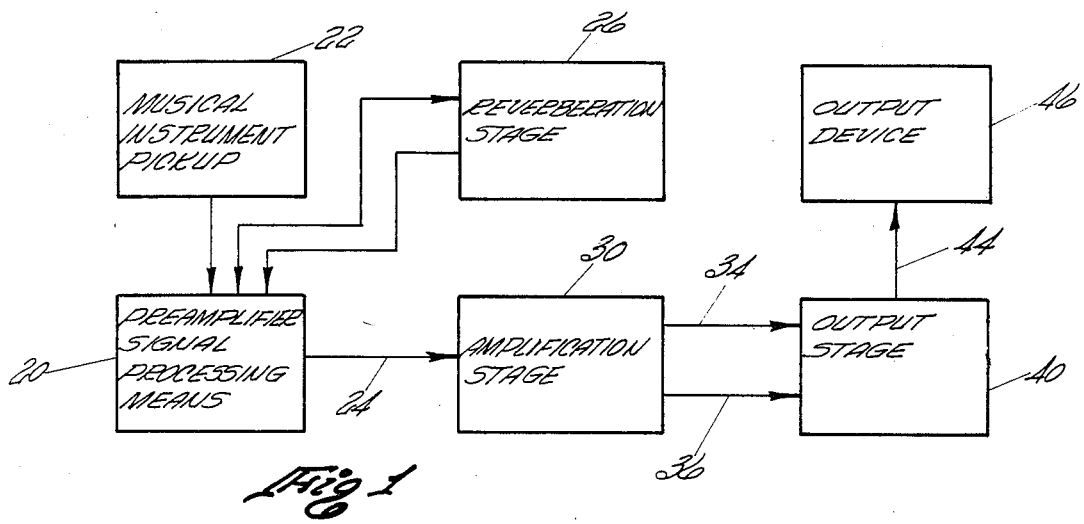
FIG. 1 is a block diagram of a complete musical instrument pickup amplification system, including the preamplifier signal processing means of the present invention.

FIG. 1 illustrates by means of a block diagram an overall musical instrument amplification system utilizing the teachings of the present invention. Specifically, FIG. 1 discloses that a preamplifier signal processing means 20 is adapted to receive audio frequency electrical signals generated by a musical instrument 22 and for providing controlled output signals therefrom, illustrated by arrow 24. The controlled output signals, illustrated by arrow 24, have selected amplification, distortion and harmonic signal content which are determined by the preamplifier signal processing means 20. If desired, the preamplifier signal processing means is adapted to have operatively connected thereto other electrical circuits which can provide electrical signal characteristics, such as a reverberation stage 26.

The output of the preamplifier signal processing means 20 are controlled output signals having selected distortion and harmonic signals which appear as output signals 24 at an output terminal in the preamplifier signal processing means. Output signals 24 are applied to an amplification stage 30 which, in turn, applies its output to an output stage 40. The amplification stage 30 and output stage 40 can be any well-known amplifier adapted for use in a musical amplification system, such as a Model DC 300 amplifier which is sold by Crown International Inc., Elkhart, Ind. The output signals of the amplification stage 30 comprises positive and negative amplified signals, as illustrated by arrows 34 and 36. The output signals 34 and 36 of the amplification stage 30 are 180 degrees out of phase and are applied as inputs to an output stage 40. Typically, an output stage may be in the form of a well-known push-pull circuit. The output from the output stage represented by arrow 44 is applied to an output device 46, which may be a speaker, speaker system, or the like.

Figure 2:
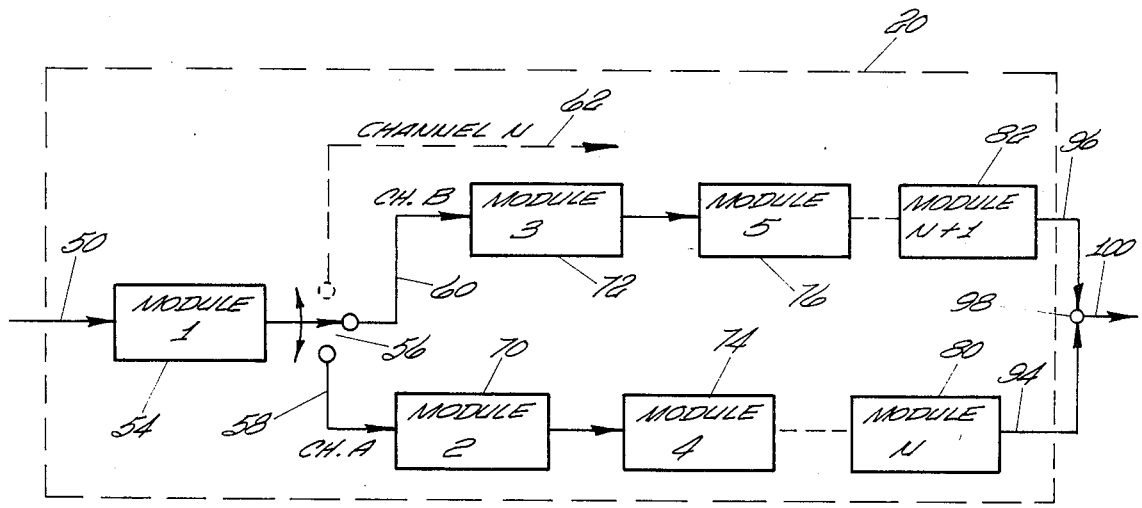
FIG. 2 is a block diagram illustrating the preamplifier of the present invention having a plurality of electrical signal processing channels, each of which has a plurality of interconnectable signal processing means and a switching means at the input thereof.

FIG. 2 illustrates the broad concept of the preamplifier signal processing means, which is illustrated by dashed line 20 and which represents the same element 20 illustrated in FIG. 1. FIG. 2 illustrates that the preamplifier signal processing means 20 receives audio frequency electrical signals as an input, which signals are represented by arrow 50. The dashed lines represent a housing for the electrical circuits described hereinbelow. The audio frequency electrical signals are generated from a musical instrument, as discussed in connection with FIG. 1. The audio frequency electrical signals are applied to an input stage which is represented by module 1 designated by numeral 54. The output of the input stage is electrically connected to a single-pole, multiple-throw switch 56. In the embodiment illustrated in FIG. 2, the preamplifier signal processing means 20 includes a number of electrical signal processing channels illustrated as channel A, designated by numeral 58; channel B, designated by numeral 60; and channel N, designated by numeral 62. The electrical signal processing channels 58, 60 and 62 are each capable of receiving the selectively processed audio frequency electrical signals from the input stage by means of a switching means 56. Each of the electrical signal processing channels 58, 60 and 62 are adapted to produce, in response to the processed audio electrical signals, controlled output signals. Each of the electrical signal processing channels 58 and 60 and channel N, being shown as a dashed line, is identified by numeral 62. The use of channel N is to illustrate that the channels which can be utilized are not limited in number. However, the preferred embodiment, as shown in FIG. 3, has two channels and the switching means located at the output thereof.

Referring again to FIG. 2, each channel includes a plurality of selectively interconnectable signal processing means, for example, module 2, identified by numeral 70; module 4, indicated by numeral 74; and module N, illustrated by numeral 80 in the first electrical signal processing channel, or channel A. Similarly, the second electrical signal processing channel 60, which is channel B, includes selectively interconnectable signal processing means, such as module 3, identified by element 72; module 5, identified by element 76; and module N+1, identified by element 82. FIG. 2 illustrates that the output of each of the electrical signal processing channels, output 94 from channel A and output 96 from channel B, are electrically connected to an output terminal 98, the output of which is illustrated by arrow 100. Output 100 is utilized as an input to a subsequent stage of electrical amplification, such as intermediate amplification stage 30 in FIG. 1.

Each of the selectively interconnectable signal processing means 70, 72, 74, 76, 80 and 82 is capable of at least one of selectively amplifying, distorting and adding preselected harmonic content to the controlled output signals from each of the respective electrical signal processing channels. The switching means 56, in this example, is located at the inputs of the electrical signal processing channel.

Figure 3:
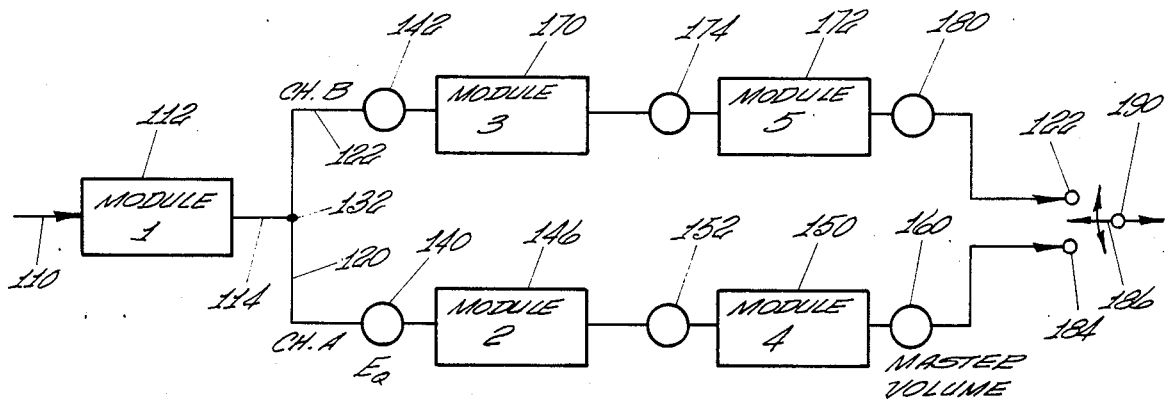
FIG. 3 is a block diagram of the preamplifier of the present invention, including an input stage and first and second electrical signal processing stages, which include interconnectable signal processing means and means for adjusting tone levels, overdrive volume of the signals along each channel and a switching means at the output thereof.

FIG. 3 illustrates the preferred embodiment for the preamplifier signal processing means which further includes control means for adjusting the tone, overdrive and volume of the signals within each of the electrical signal processing channels. Specifically, an input signal in the form of an audio frequency electrical signal, illustrated by arrow 110, is applied as an input to the input means, module 112, which is capable of selectively processing, such as selectively amplifying the audio frequency electrical signals generated by a musical instrument, which is illustrated by musical instrument 22 of FIG. 1. In the preferred embodiment, the input means module is selected to amplify the audio frequency electrical signal which produces, as an output signal, a selectively amplified audio frequency electrical signal which appears in output 114. In the embodiment of FIG. 3, the preamplifier includes a first and a second electrical signal processing channel, designated as channel 120 for channel A and 122 for channel B. The output appearing in output 114 from the first module 112 is supplied to a terminal or common point 132. The input of the first electrical processing signal channel 120 is connected to common point 132, and the input of the second electrical signal processing channel 122 is likewise connected to common point 132.

The first electrical signal processing channel 120 includes a tone control, illustrated by element 140, while the second electrical signal processing channel 122 includes a tone control 142. A typical tone control circuit is illustrated herein as FIG. 10. Each of the electrical signal processing channels 120 and 122 are capable of receiving from the input processing module 112 processed audio frequency electrical signals which are adapted to be further processed by each of the first and second electrical signal processing channels 120 and 122. The first electrical signal processing channel 120 includes, in addition to tone control 140, a pair of selectively interconnectable signal processing means 146 and 150. An overdrive control means 152 is provided as a means for selectively applying a portion of the output signal received from module 146 to a module 150. The output of module 150 is controlled by a master volume control means 160 to control the magnitude of the output signal ultimately applied to terminal 184 of a single-pole, double-throw switch 186. The switch 186 applies the output signal to an output terminal 190. The second electrical signal processing channel 122 likewise includes, in addition to the tone control 142, a module 170 and a module 172, an overdrive control means 174 and a master volume control means 180. The output of the master volume control means 180 is applied to terminal 182 of the single-pole, double-throw switch 186. The controlled amplitude output signal which appears at output terminal 190 is applied to the input of an amplification stage.

Module 112 of the input stage, modules 146 and 150 of the first electrical signal processing channel 120 and modules 170 and 172 of the second electrical signal processing channel 122 contain interchangeable signal processing means in the form of electrical circuits which are capable of at least one of selectively amplifying, distorting or adding preselected harmonic content to the electrical signals being processed by each of the various stages. The interchangeable signal processing means produce the controlled output signals having characteristics determined by the specific circuitry utilized in each of the modules.

Figure 4:
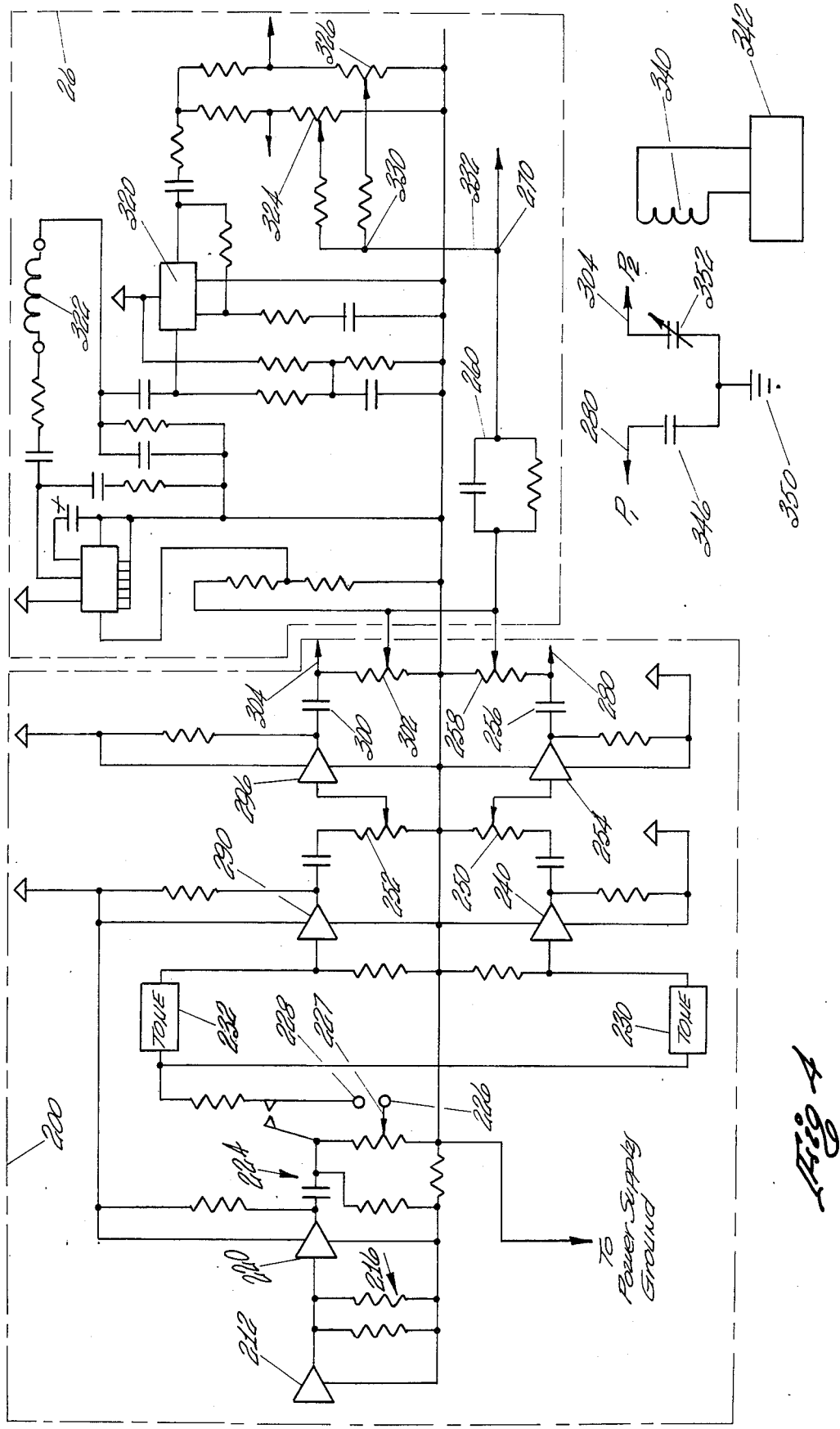
FIG. 4 is an electrical schematic diagram of the preamplifier system of the preferred embodiment of the present invention showing circuit means which includes an input stage and a first and second electrical signal processing stage and associate circuitry thereof.

FIG. 4 is a schematic diagram of the preferred embodiment of a preamplifier having stages corresponding to the block diagram of FIG. 3. However, the interchangeable signal processing means are shown generally in FIG. 4. FIGS. 5, 6, 7, 8 and 9, described hereinafter, are circuits for the interchangeable signal processing means of the preferred embodiment which can be utilized in the schematic diagram of FIG. 4.

In the schematic diagram of FIG. 4, which illustrates the electrical wiring for the preamplifier illustrated by the block diagram in FIG. 3, the portion of the electrical circuit diagram enclosed by dashed box 200 corresponds to the circuit of FIG. 3. The portion of the circuit which is enclosed by the other dashed box 26 represents a reverberation control circuit which is electrically connected to the preamplifier of the present invention.

The preamplifier shown by dashed line 200 is adapted to receive audio frequency electrical signals generated by a musical instrument which is applied at input 212. The electrical signals are applied across a resistance network 216 as an input to an input means 220. The output of the input means 220 is applied to a special effects loop, illustrated generally as 224. The special effects loop 224 allows adjustment of the signal level being applied to the effects loop to optimize the signal-to-noise ratio of the signal. The input stage, including input means 220, effectively acts as a buffer for the electrical pickup operatively connected to the input 212 which functions to isolate the effects loop from the electromagnetic pickup. This results in reduced noise and a clean signal after the first input means 220. The special effects loop 224 has an "Effects Send" position, illustrated by pole position 226. When the switch is in the "Effects Send" position, illustrated by pole member 227 contacting position 226, the output of the input means 220 is applied to the input of the effects loop. When the pole member 227 contacts position 228, which is the "Effects Return" position, the input is derived from the output of the effects loop. The output of the effects loop 224 is applied to the first and second electrical signal processing channels. In FIG. 4, the first channel includes a tone control 230, and the second electrical signal processing channel includes a tone control 232. The output from tone control 230, which is electrically located in the first electrical signal processing channel, is applied to a first selectively interchangeable signal processing means 240 which is capable of at least one of selectively amplifying, distorting and adding preselected harmonic content to the first controlled output signal. The output of the first selectively interconnectable signal processing means 240 is applied through a variable potentiometer 250, which acts as an overdrive or means for controlling the magnitude of the signal from the first selectively interconnectable signal processing means 240 to a second selectively interconnectable signal processing means 254. Thus, the signal from variable potentiometer 250 functions as an input to the second selectively interconnectable signal processing means 254 of the first electrical signal processing channel. The output of the second selectively interconnectable signal processing means 254 is applied via a coupling capacitor 256, a master output control potentiometer 258 and an RC coupling circuit 260 to an output terminal 270. In addition, the coupling capacitor 256 likewise applies the output signal from the second selectively interconnectable signal processing means 254 to a lead 280 which is electrically connected to a contact of a relay. If the coil of the relay is actuated, the relay contact electrically connects lead 280 to ground, which effectively shorts out the first electrical signal processing channel and prevents the application of any electrical signals thereacross to the RC coupling network 260 and subsequently to the output terminal 270.

In a similar manner, the second electrical signal processing channel, which includes tone control 232, includes a third selectively interconnectable signal processing means 290 and an overdrive control potentiometer 252 which applies its output in a similar manner as described hereinbefore for the first electrical signal processing means to the fourth selectively interconnectable signal processing means 296. The output of processing means 296 is applied by a coupling capacitor 300 to a master potentiometer 302 and to lead 304, which is electrically connected to a normally closed contact of a relay. In a similar manner, if the relay coil is not actuated, the relay contact electrically connects lead 304 to ground, thereby shorting out and preventing the output from the fourth selectively interconnectable signal processing means 296 from being applied to the master control potentiometer 302. The output of master control potentiometer 302 is likewise applied through the RC coupling network 260 to the output terminal 270.

In the circuit diagram of FIG. 4, the input means 220 and the first, second, third and fourth selectively interconnectable signal processing means 240, 254, 290 and 296, respectively, are electrical circuits at least one of which is capable of at least one of selectively amplifying, distorting and adding preselected harmonic content to the first controlled output signal or the second controlled output signal by the RC coupling network 260 to the output terminal 270.

In the circuit diagram of FIG. 4, the reverberation circuit shown by dashed line 26 (which corresponds to the reverberation control 26 of FIG. 1) can be selectively switched into or out of the circuit to provide for the reverberation effect. The circuitry illustrated in FIG. 1 within dashed box 26 is known in the art and includes an integrated circuit 320, which may be an integrated circuit element such as NE-5534 integrated circuit. A reverberation coil 322 for storing the electrical signals to provide the reverberation effect wherein the magnitude of the reverberation for each channel is controlled by potentiometers 324 and 326, the outputs of which are electrically connected to a common point 330 which is, in turn, electrically connected by lead 332 to the common output terminal 270. Thus, the common output terminal 270 functions as a summing point for the outputs of each of the electrical signal processing channels and output from the reverberation circuitry 26.

In operation, a relay coil 340, when actuated by a foot switch 342, mechanically closes the normally open contact 346, which is operatively connected between lead 280 and ground 350. The output 304 from the second electrical signal processing channel is applied via a normally closed contact 352 to ground 350, which occurs when the relay coil 340 is not energized. Thus, depending on the position of the foot switch 342 and whether coil 340 is energized or deenergized, at least one of the first electrical signal processing channel and the second electrical signal processing channel is electrically grounded and thereby disconnected from the output terminal 270.

The electrical circuit diagrams of FIGS. 5 through 9, inclusive, which will be discussed hereinafter, are circuits which are capable of at least one of selectively amplifying, distorting or adding preselected harmonic content to the second controlled amplitude output signal. Any one of the circuits described hereinbelow with respect to FIGS. 5 through 9, inclusive, can be inserted into the input means 220 or into any one of the first through fourth of the selectively interconnectable signal processing means 240, 254, 290 and 296, respectively, all as illustrated in FIG. 4.

Figure 5:
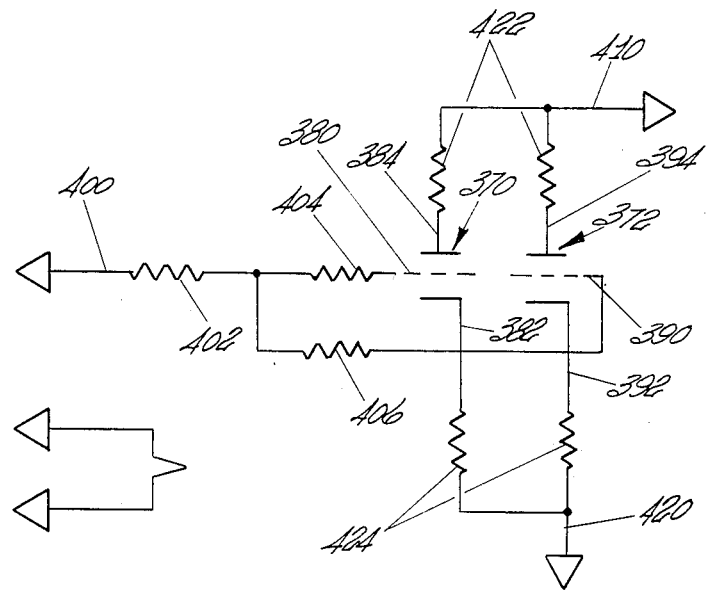
FIG. 5 is an electrical schematic diagram of the interconnectable signal processing means in the form of a pluggable module which is adapted for amplifying an audio signal.

The circuit illustrated in FIG. 5 can be characterized as a "normal" module schematic utilizing a dual-triode vacuum tube, such as a 12AX7, having a first triode 370 and a second triode 372. Triode 370 has a grid 380, a cathode 382, and an anode 384. The second triode stage 372 has a grid 390, a cathode 392, and an anode 394. In use, an input signal is applied across input 400 which applies the input signal through an input resistor 402 and grid resistors 404 and 406 to grids 380 and 390, respectively. The output signal from the first triode tube 370 appears at lead 410, with lead 420 being electrically grounded. Plate resistors 422 and cathode resistors 424 function as a voltage-dividing network to establish operating characteristics of the tube. In this arrangement, it is desirable to use a dual-triode vacuum tube having high u in order to obtain the amplification of the signal. The circuit illustrated in FIG. 5 provides an output signal which can be characterized as clean and quiet, with low distortion. The frequency range is in the order of 20 hertz to 20 kilohertz.

Figure 6:
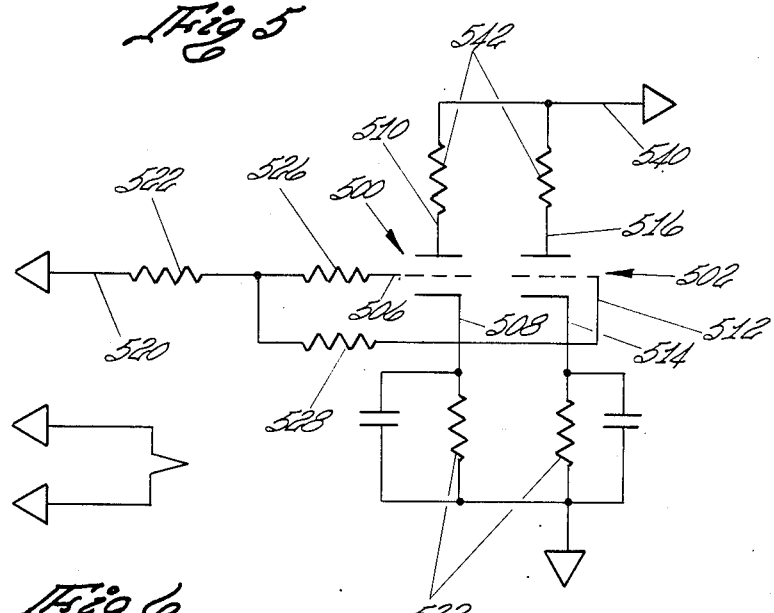
FIG. 6 is an electrical schematic diagram of an interconnectable signal processing means in the form of a pluggable module for producing distortion in the electrical signals.

FIG. 6 illustrates a "classical" module schematic diagram utilizing a dual-triode vacuum tube having a high u. In the circuit of FIG. 6, the circuit utilizes a dual-triode vacuum tube having triode stages 500 and 502. Triode stage 500 has a grid 506, a cathode 508, and an anode 510. The second triode stage 502 has a grid 512, a cathode 514, and an anode 516. An input signal is applied to input 520 across a voltage-dropping resistor 522 and is applied via grid resistors 526 and 528 to the grids 506 and 512, respectively. In the embodiment of FIG. 6, the cathodes 508 and 514 are electrically connected through RC networks 532. The anodes 510 and 516 are electrically connected to an output 540 by means of anode resistors 542. The output from the "classical" module schematic of FIG. 6 can be characterized as having approximately six db more gain than the circuit illustrated in FIG. 5 and has a higher distortion level than the circuit of FIG. 5. The frequency range of the circuit of FIG. 6 is approximately 70 hertz to 17,000 hertz.

Figure 7:
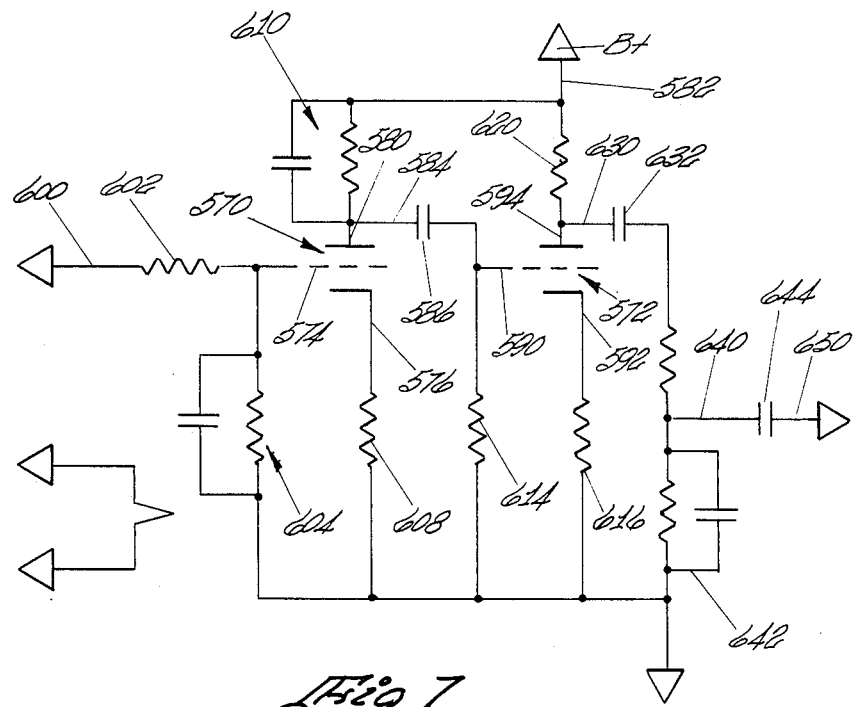
FIG. 7 is an electrical schematic diagram of an interconnectable signal processing means in the form of a pluggable module for producing high, overdrive signals in the electrical signal.

FIG. 7 illustrates a "high-gain" module schematic utilizing a high u dual-triode vacuum tube, such as a 12AX7. In the embodiment of FIG. 7, the dual-triode vacuum tube has triode stages 570 and 572. Triode stage 570 has a grid 574, a cathode 576, and an anode 580. The other triode stage 572 includes a grid 590, a cathode 592, and an anode 594. The input signal to this stage is applied to input 600 which applies the signal across a dropping resistor 602 to the grid 574 of triode 570. Also, the signal after the dropping resistor 602 is applied across blocking RC network 604. An RC network 610 is connected across the anode 580 to B+ power supply which appears on terminal 582. The output signal developed from the first triode stage appears on output 584 and is coupled by an AC coupling capacitor 586 to the grid 590 of the second triode stage 572. A grid resistor 614 establishes the operating voltage for the grid. The cathode 592 has its operating characteristics established by a cathode resistor 616. The anode 594 of the second triode 572 is electrically connected by a resistor 620 to the B+ power supply appearing on lead 582.

The output signals developed by the second triode 570 appear on output 630, which output signals are applied by a coupling capacitor 632 to output 640. An RC network 642, in cooperation with the AC coupling capacitor 644, establishes the band of the electrical signal ultimately appearing on output lead 650. The circuit illustrated in FIG. 7 can be characterized as two cascaded stages which are similar to two independent amplifying stages illustrated in FIG. 5. In one embodiment, the circuit has 34 decibels more gain than that of FIG. 5, resulting in higher overdrive, and has a frequency output range of 150 hertz to 10,000 hertz.

Figure 8:
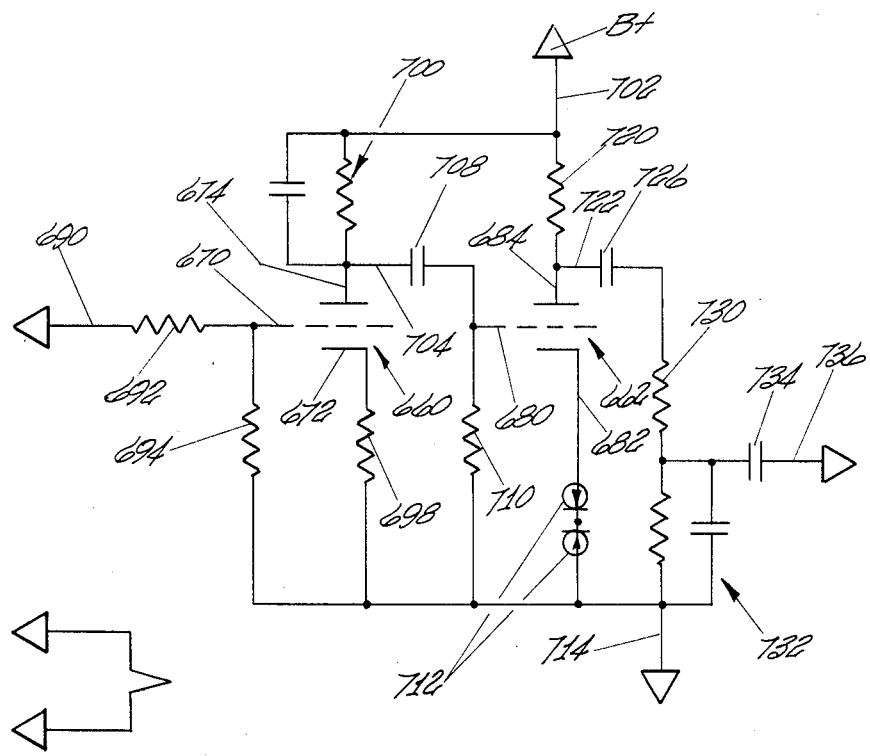
FIG. 8 is an electrical schematic diagram of an interconnectable signal processing means in the form of a pluggable module for providing a smooth overdrive and increased band width in the electrical signal.

The circuit illustrated in FIG. 8 likewise utilizes a dual-triode vacuum tube having a high u, such as a 12AX7 vacuum tube. In the circuit illustrated in FIG. 8, the dual-triode vacuum tube has a first triode stage 660 and a second triode stage 662. The first triode stage 660 includes a grid 670, a cathode 672, and an anode 674. The second triode stage 662 includes a grid 680, a cathode 682 and an anode 684. An input signal is applied to this stage on lead 690, across a voltage-dividing network, comprising dropping resistors 692 and 694, to grid 670 of the first triode 660. The cathode of the first stage 660 is electrically connected by a voltage-dropping resistor 698 to ground. The anode 674 is electrically connected by an RC network 700 across a B+ power supply on lead 702. The output from the first triode 660 appears on output 704 and is coupled via an AC-coupling capacitor 708 to the grid 680 of the second triode 662. A resistor 710 is electrically connected between the grid 680 and ground 714 to establish the operating characteristics of the triode 662. The cathode 682 of the second triode 662 is connected across a pair of back-to-back PN diodes, shown generally as 712, such as PN diodes CL-1301. The diodes 712 establish a cut-off level for the positive-going and negative-going excursions of the voltages developed between the cathode 682 and ground 714. The anode 684 of the second triode 662 is connected via a voltage-dropping resistor 720 to the B+ power supply appearing on lead 702. The output of the second triode 662 appears across output 722 which is applied via a coupling capacitor 726 across a voltage-dropping resistor 730, an RC network 732 and via a second AC coupling capacitor 734 to output lead 736. The circuit illustrated in FIG. 8 can be characterized as producing a very rounded output signal having high distortion and very hard overdrive.

Figure 9:
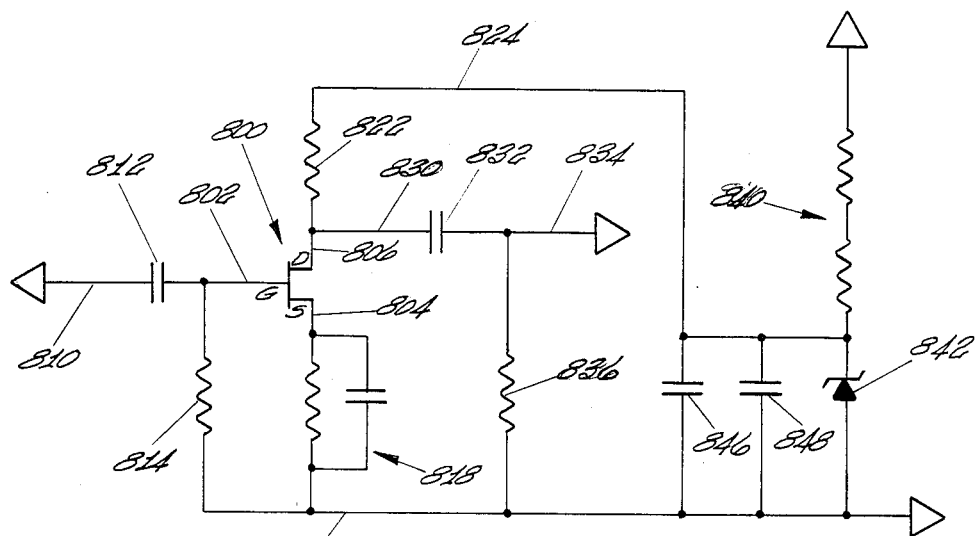
FIG. 9 is an electrical schematic diagram of an interconnectable signal processing means in the form of a pluggable module for producing lower order harmonics and a hard overdrive in the electrical signal.

FIG. 9 illustrates a schematic diagram of a circuit utilizing a field effect transistor, such as a General Electric FET-1 or equivalent. The field effect transistor 800 has a gate 802, a source 804, and a drain 806. An input signal is applied to input 810 and is coupled by a coupling capacitor 812 to the gate 802. A voltage-dropping resistor 814 establishes the operating voltages required for the field effect transistor 800. The source 804 is electrically connected via an RC network, shown generally as 818, to ground 820, while the drain 806 is electrically connected to a voltage-dropping resistor 822 which, in turn, is connected to a B+ power supply which appears on lead 824. The output of the drain 806 appears on lead 830 and is coupled by an AC-coupling capacitor 832 and applied to output 834, which output is electrically connected across a high-impedance resistor 836 to ground 820. The B+ lead 824 is electrically connected to a clamping network which comprises resistors 840 and a clamping zener diode 842. Noise-suppression capacitors 846 and 848 are connected across the B+ power supply and ground to remove spurious noise from the B+ power supply which is generated by the clamping effect of the zener diode 842. In the preferred embodiment, the zener diode is No. 1N4748 which has a 22 volt rating and one watt capacity. The circuitry illustrated in FIG. 9 can be characterized as providing smooth, lower-order harmonics in a manner similar to a vacuum tube without any of the microphonics associated with the vacuum tube. The circuit overall has lower noise, has a slightly harder overdrive characteristic than a vacuum tube and exhibits a long life. One application for the circuit illustrated in FIG. 9 is in connection with keyboards and synthesizers.

Figure 10:
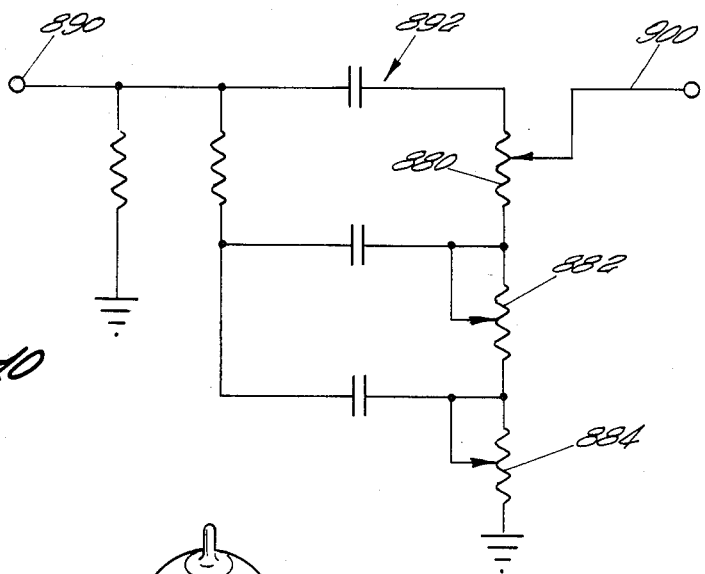
FIG. 10 is an electrical schematic diagram of a tone control circuit for providing treble, bass and midrange adjustments.

FIG. 10 illustrates a typical tone control circuit which can be utilized for the tone controls referenced as tone controls 230 and 232 in FIG. 4. The tone control circuit includes three variable potentiometers, such as potentiometer 880 for treble frequencies, potentiometer 882 for bass frequencies, and potentiometer 884 for midrange frequencies. The input to the tone control circuits are applied to input 890. The signal received at 890 is applied via the resistor at RC network, shown generally as 892, to each of the potentiometers. The output from the tone control circuit appears on output 900. As set forth in connection with the description of the first electrical signal processing channel and the second electrical signal processing channel described in connection with FIGS. 3 and 4, each of the first and second electrical signal processing circuits includes its own separate tone control circuit.

Figure 11:
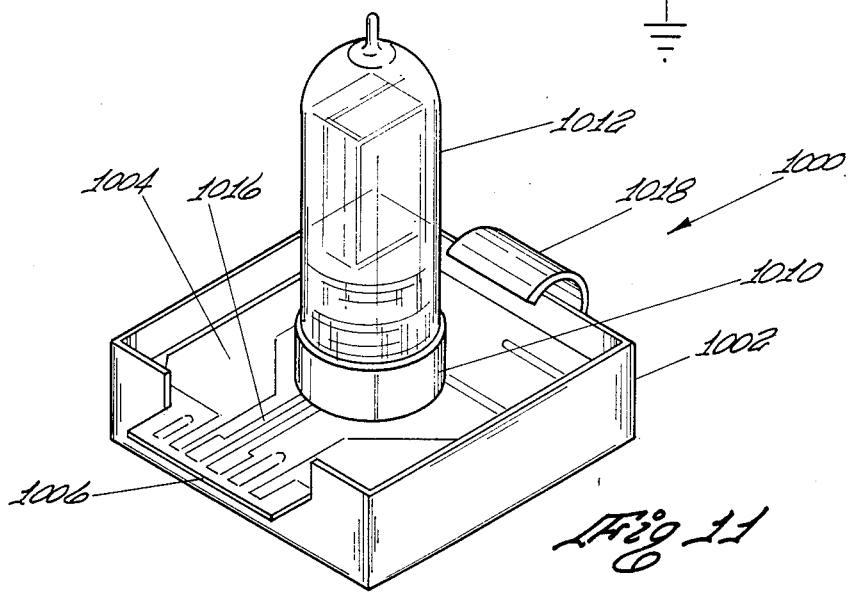
FIG. 11 is a perspective top view of one example of a pluggable module circuit having a single vacuum tube.

FIG. 11 is a perspective view of a pluggable module which can be utilized for the selectively interconnectable processing means described in connection with FIGS. 3 and 4 and specifically for the circuitry illustrated in FIGS. 4 through 9. The pluggable module, shown generally as 1000, includes a generally rectangular-shaped support 1002 which has mounted therein a small printed circuit board 1004 which has extending therefrom an elongated electrical connecting means 1006. In the embodiment illustrated in FIG. 11, the printed circuit board 1004 includes a tube socket support 1010 which is adapted to support a vacuum tube, shown as 1012. Other discrete components which are required for the circuit are mounted on the printed circuit board 1004. The printed circuit board 1004 likewise includes printed circuit means, shown generally as 1016, which is formed into a predetermined pattern and electrically connects all the components and active elements together to form a circuit, such as the circuit illustrated in FIG. 5. A handle 1018 facilitates insertion and removal of the pluggable module from the mother printed circuit board.

In the preferred embodiment, the pluggable module illustrated in FIG. 11 is adapted to be plugged into a printed circuit board having the circuit means described in FIG. 4. The printed circuit board includes connecting means which forms part of the input means or part of the selectively interconnectable signal processing circuits, as described herein, to permit the pluggable module to be selectively inserted into and removed from the printed circuit board. In concept, any one of the circuits described herein in FIGS. 5 through 9 can be fabricated into a pluggable module in the format of FIG. 11. Of course, not all of the circuit diagrams that are possible are illustrated in FIGS. 5 through 9, and it is understood that those illustrated herein are merely exemplary in nature and that any type of electrical circuit which utilizes vacuum tubes, solid-state components or any combination thereof can be utilized as a selectively interchangeable signal processing means which can be utilized in the circuits as described herein.

Figure 12:
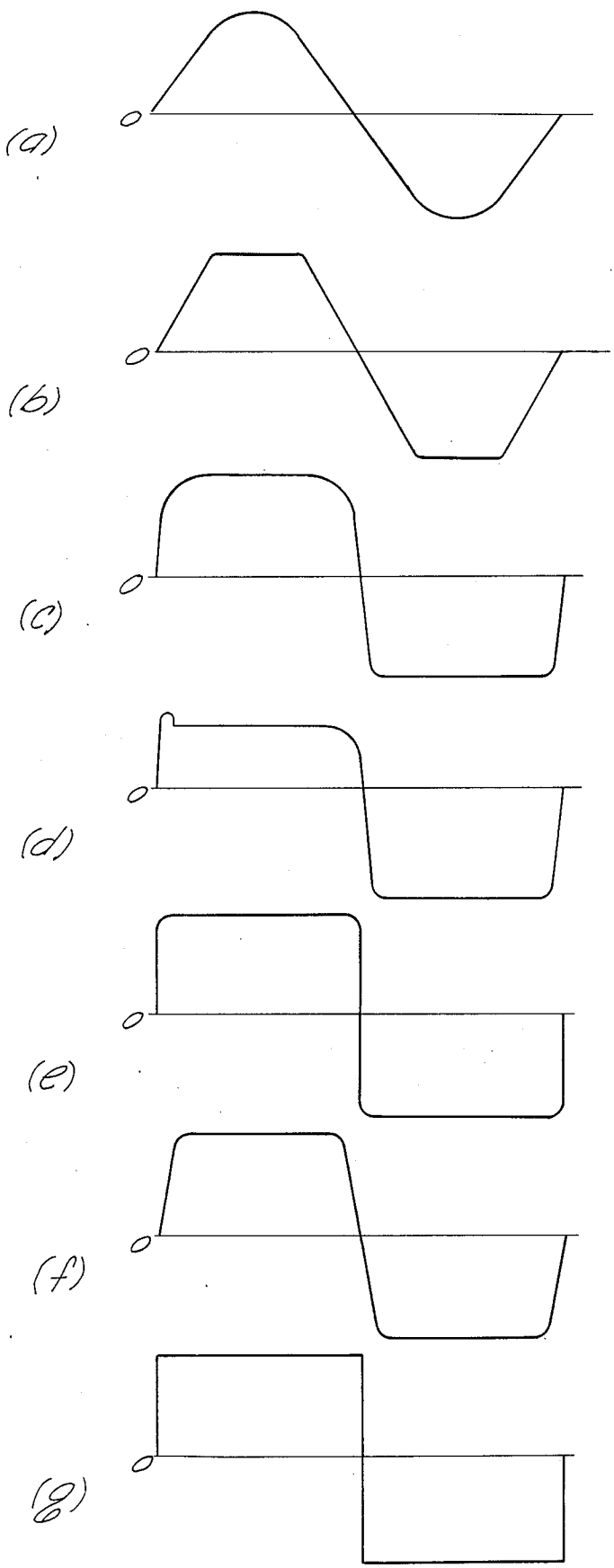
FIG. 12(a–g) shows waveforms illustrating an input sound wave and the effects introduced into the signals by the signal processing modules and wherein the circuitry illustrated for the pluggable modules in FIGS. 5, 6, 7, 8 and 9 are capable of producing waveforms as illustrated in FIG. 12(b–f), respectively.

FIG. 12 discloses waveforms to show the operating effect of circuits on a sine wave signal. The waveforms specifically illustrate the effects of the circuits of FIGS. 5 through 9 on the sine wave signal. The waveforms in FIGS. 12(a) through 12(g) are illustrated on the basis that all modules are in an overdrive stage. The input signal utilized and illustrated in waveform 12(a) can be characterized as a low-distortion sine wave having a frequency rate of one kilohertz with a 10 millivolt RMS.

The waveform illustrated in FIG. 12(b) is generated by a circuit similar to that of FIG. 5 and exhibits an overdrive at approximately one volt with a 20 db gain. Note that the waveform illustrated in FIG. 12(b) is relatively smooth and that the positive-going excursion very closely follows that of the input sine wave illustrated in waveform 12(a).

The waveform of FIG. 12(c) represents the response of the circuit in FIG. 6. As illustrated in FIG. 12(c), the waveform becomes slightly rounded in shape and more like a square wave. The circuit goes into overdrive at approximately one volt and provides a gain of approximately 26 db.

The waveform of FIG. 12(d) illustrates the effect that the circuit of FIG. 7 would have on the input of 12(a).

The signal becomes generally square-shaped with the positive-going excursion having a slight impulse on the leading edge of the waveform, thereby exhibiting some high frequency boost. The circuit goes into overdrive at approximately one volt and exhibits a 50 db gain.

The waveform of FIG. 12(e) illustrates the signal produced by the circuit of FIG. 8, which is characterized as a high-gain, clamped circuit The waveform is relatively rectangular in shape, and the circuit is designed to overdrive at approximately one volt with a gain of 50 db.

The waveform of FIG. 12(f) illustrates the signal produced by the circuit of FIG. 9 in response to the input sine wave of 12(a). The signal is somewhat trapezoidal in shape, is clean with low distortion, and the circuit goes into overdrive at approximately one volt. The gain is in the order of 20 db.

The waveform of FIG. 12(g) illustrates a waveform which can be generated by an appropriate selectively interconnectable signal processing circuit utilizing an integrated circuit wherein the integrated circuit is designed to specifically generate a square wave. In one embodiment, the IC circuit is driven into overdrive at approximately 0.3 volt and has a gain of 20 db.

Figure 13:
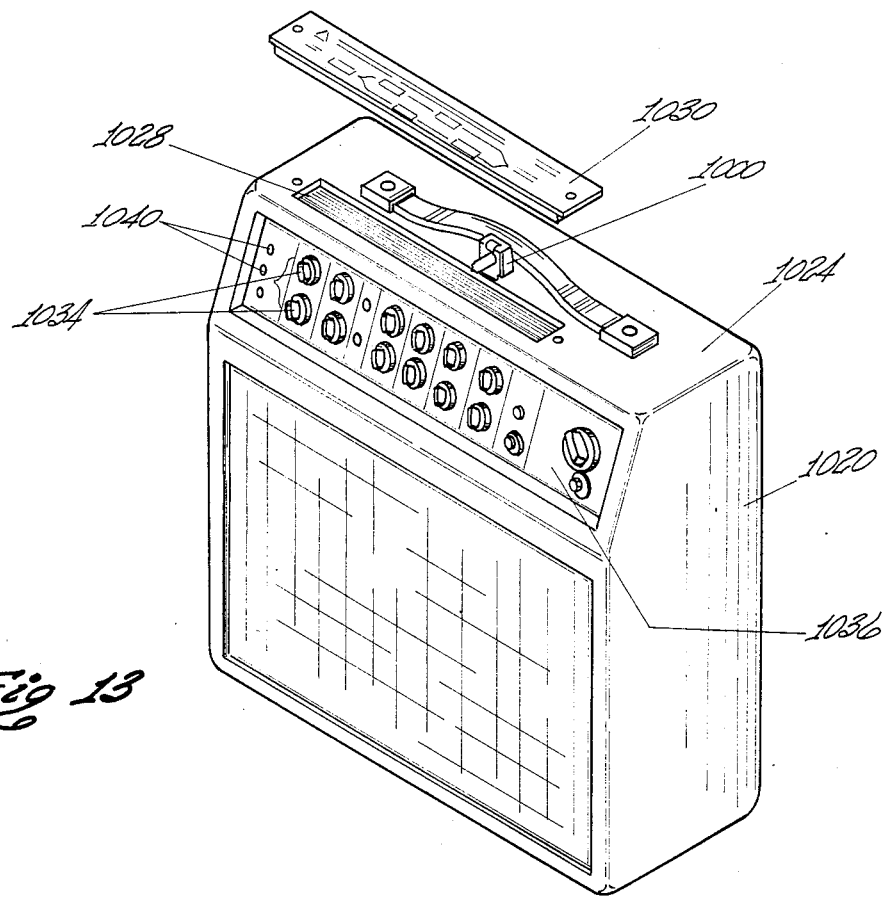
FIG. 13 is a perspective view of an embodiment of an integrated amplifier system having the preamplifier signal processing means and access thereto located at the top thereof.

FIG. 13 illustrates a preamplifier which includes a housing 1020 for defining a surface 1024 which defines an elongated opening 1028. A cover member 1030 is adapted to be removably attached to the top surface 24 by means of fasteners (not shown). The geometrical dimension of the elongated opening 1028 is adapted to receive and pass a pluggable module 1000. The preamplifier further includes external circuit adjustment controls, shown generally as 1034, which extend from the printed circuit board located interior to the housing 1020 and through a plurality of openings in the control panel 1036 of the housing 1020. The housing further supports input connecting means 1040 which are adapted to receive an input jack from an electrical instrument, the signals of which are to be processed. In addition, the housing 1020 includes an interior cavity located in the lower portion of the housing for a speaker. The circuit means, which is located in the upper section of the housing 1020, includes both the preamplifier and, if desired, an amplifier for amplifying the processed preamplified signals.

Figure 14:
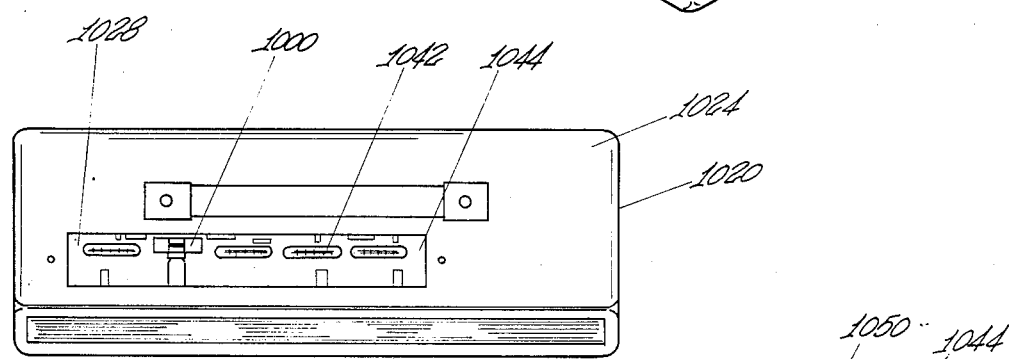
FIG. 14 is a top view of the amplifier of FIG. 13 showing a printer circuit board with connectors for receiving the pluggable modules.

FIG. 14 illustrates the housing 1020 and shows the top surface 1024 which defines the opening 1028. As illustrated in FIG. 14, the opening 1028 has sufficient geometrical dimension to receive and pass a pluggable module 1000, which is shown to be interconnected into the mother printed circuit board 1044. The mother printed circuit board 1044 includes a plurality of electrical connectors of which 1042 is typical.

Figure 15:
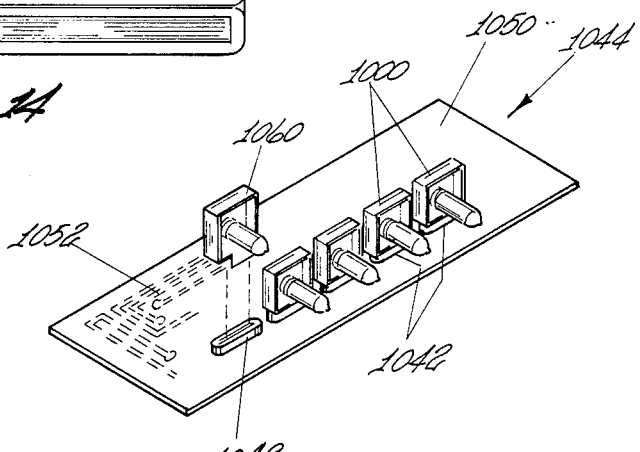
FIG. 15 illustrates the preferred embodiment of a primary circuit board for the preamplifier circuit and a plurality of pluggable modules formed of circuit means having selected signal processing characteristics.

FIG. 15 illustrates an electrical circuit means, shown generally as 1050, which functions as the mother board 1044. The electrical circuit means 1050 includes means for defining electrical conductor paths formed into a predetermined pattern of which electrical conductor path 1052 is typical. The circuit means includes a first electrical signal processing channel which is capable of receiving a selectively amplified audio frequency electrical signals. The circuit means 1050 includes a plurality of connecting means 1042 which are located on a printed circuit means 1050 and are electrically connected to the electrical conductor paths illustrated as 1052. In addition, the circuit means includes means for defining the electrical signal processing channels, and the electrical signal processing channels are adaptable to receive pluggable signal processing modules, such as module 1000, which are removably inserted into the electrical connectors 1042. Module 1060 is illustrated in a position where the module is removed from the connector 1042.

As illustrated in FIG. 15, at least two pluggable signal processing modules, such as modules 1000 and 1060, are adapted to be inserted into one of a plurality of connecting means, such as connecting means 1042, so as to be electrically connected to the first and second electrical signal processing channels included in the circuit means 1050. The pluggable signal processing modules 1000 and 1060 include electronic means which is capable of at least one of selectively amplifying, distorting and adding preselected harmonic content to the selectively amplified audio frequency electrical signal to produce processed output signals. In addition, the circuit means includes an output terminal which is operatively coupled to the circuit means for receiving the processed output signals.

In use, subsequent amplification stages are adapted to receive from the preamplifier the processed signal located on the output terminal and are adapted to amplify the signal in a normal manner. As discussed in connection with FIG. 13 above, an amplifier can be located in the upper portion of the housing 1020 and, if desired, the preamplifier, control panel and amplifier can be formed into an integral amplification system.

Referring again to FIGS. 13 and 14, in use the cover 1030 is removed from the housing 1020 and the pluggable module 1000 having the preselected processing characteristics can be removably inserted into the preamplifier through the opening 1028. By selecting the electrical characteristics of the pluggable module 1000, the characteristics of the signals processed by the processing channel can be selected. The external control means 1034 on the amplifier control panel 1036 provides means for adjusting the characteristics of the signals, as discussed in connection with FIG. 3.

By utilizing the teaching of the present invention when playing a musical instrument, the preamplifier allows a user to change tone or sound quickly and easily by actuation of a switching means. This enables the user to develop a number of different playing styles for different entertainment groups or to permit the user to change one tone or style to a second tone or style without the purchase of additional amplification equipment. The use of such amplifier has utility in concerts, recording studios, and the like, and has the benefit of providing a substantial amount of control to the user to quickly and easily change the tone and sound of the music developed by the musical instrument.

Because of the modular structure of each stage, each pluggable module or the selectively interconnectable signal processing stages are independent from each other. As illustrated in connection with FIGS. 5 through 9, a vacuum tube, such as a dual-triode vacuum tube, can be used for two different purposes, thereby resulting in efficient use of a vacuum tube in a circuit which is small and compact and which can be assembled in the manner as illustrated in the pluggable module of FIG. 10. The preamplifier of the present invention enables the circuitry to be easily serviced. The circuit is highly dependable due to its isolation characteristics on a stage-to-stage basis and permits a user to customize the user's tone and sound so that the tones and sounds of a user can be specifically adjusted to represent the characteristic sound desired by such a user of the musical instrument.

In the preferred embodiment, the musical instrument is a guitar having an electromagnetic pickup mounted thereon. Electromagnetic pickups are well known in the art and can produce a wide variety of output signals and sounds on their own behalf. Thus, by matching the characteristics of the electromagnetic pickup with the characteristics of the preamplifier, a wide range of unique and novel sounds can be generated by the use. However, the input to the preamplifier can be utilized from a wide range of musical instruments, such as keyboards, synthesizers, multistringed instruments, and the like.

One feature of the pluggable module approach utilized in the preamplifier of the present invention is that a wide number of specific, unique circuits can be designed to develop a wide range of noises, sounds, harmonics, or the like. The use of vacuum tubes alone or vacuum tubes in combination with solid-state devices such as field effect transistors, clamping diodes, and the like or the use of straight solid-state devices such as field effect transistors in lieu of vacuum tubes is envisioned to be within the teachings of the present invention.

As a user becomes more familiar with the wide range of amplification, distortion, and the amount of harmonics which can be added, it is anticipated that the user can utilize a wide number of specifically designed circuits to produce specific sounds, all of which can be plugged into the standard preamplifier circuit to produce the desired sound.

It is envisioned that the output of the preamplifier can be applied to a straight conventional amplifier such that the harmonics, distortion and other tone or sound qualities are developed solely within the preamplifier, and the amplifier merely performs the function of amplifying the input signal. This avoids the requirement or use of amplifiers being driven into an overdriven condition or state in order to generate the nonlinear distortion sound which is desired in certain applications.

The preamplifier of the present invention permits the signal, tone, quality, distortion, and the like, to be selectively developed as described herein, and the output signal can then be applied as an input to an amplifier. The amplifier can be played for listening or practice at a relatively low level since it is unnecessary to drive the amplifier into saturation or overdrive to obtain the distortion or nonlinear sounds sometimes desired in connection with certain types of music.

In addition, the output of the preamplifier can be applied to an amplifier having variable power control capabilities. Also, if desired, the amplifier itself can controllably add other harmonics to the amplified signal.

The schematic diagram of the basic circuit and the circuit diagram of the interconnectable signal processing stages are merely exemplary. It is envisioned that additional circuits can be designed using other vacuum tubes alone, vacuum tubes in combination with solid-state devices, or solid-state devices alone to obtain a wide range of electrical signals which are selectively amplified or have distortion or harmonic control added thereto.

What is claimed is:

1. A preamplifier adapted to receive audio frequency electrical signals generated by a musical instrument comprising:

input means adapted to selectively process the audio frequency electrical signals;

a plurality of electrical signal processing channels, each being operatively coupled to said input processing means for receiving said selectively processed audio frequency electrical signals and for producing in response thereto a plurality of separate output signals equal in number to the number of electrical signal processing channels, each of said electrical processing channels including a plurality of selectively interconnectable signal processing means at least one of which is capable of selectively amplifying with an module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics to said plurality of output signals; and means including an output operatively coupled to said plurality of electrical signal processing channels for selectively applying one of said plurality of output signals to said output.

2. The preamplifier of claim 1 wherein said input means includes:

amplifying means for selectively amplifying said audio frequency electrical signals prior to said audio frequency electrical signals being applied to said plurality of electrical signal processing channels.

3. The preamplifier of claim 2 wherein said plurality of electrical signal processing channels have their inputs electrically connected to the output of said amplifying means and wherein said selectively applying means is a controlled switch operatively coupled to each of said plurality of electrical signal processing channels for applying a selected one of the output signals to said terminal.

4. The preamplifier of claim 1 wherein each of said plurality of electrical signal processing channels includes at least one selectively interconnectable signal processing means.

5. The preamplifier of claim 4 wherein at least one of the selectively interconnectable signal processing means includes a vacuum tube.

6. The preamplifier of claim 5 wherein said vacuum tube is a triode.

7. The preamplifier of claim 4 wherein at least one of the selectively interconnectable signal processing means includes a field effect transistor.

8. A preamplifier adapted to receive audio frequency electrical signals generated by a musical instrument for providing controlled output signals therefrom having selected distortion and harmonic content, said preamplifier comprising:

input means adapted to selectively process the audio frequency electrical signals generated by said musical instrument;

two electrical signal processing channels, being each capable of receiving from said input processing means said selectively processed audio frequency electrical signals and for producing in response thereto first and second controlled output signals, each of said electrical processing channels including a plurality of selectively interconnectable signal processing means at least one of which is capable of selectively amplifying with a module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics to the first and second controlled output signals; and means including a preamplifier output terminal operatively coupled to said first and second electrical signal processing channels for selectively applying one of said first and second controlled output signals to said preamplifier output.

9. The preamplifier of claim 8 wherein said input means includes an amplifying means for producing selectively amplified audio frequency electrical signals.

10. The preamplifier of claim 8 wherein at least one of the selectively interconnectable signal processing means includes a vacuum tube.

11. The preamplifier of claim 10 wherein said vacuum tube is a triode.

12. The preamplifier of claim 8 wherein at least one of the selectively interconnectable signal processing means includes a field effect transistor.

13. A preamplifier adapted to receive audio frequency electrical signals generated by a musical instrument for providing controlled output signals therefrom having selected distortion and harmonic content, said preamplifier comprising:

means adapted to selectively amplify the audio frequency electrical signals generated by said musical instrument;

a first electrical signal processing channel operatively coupled amplifying means for receiving said selectively amplified audio frequency electrical signals and for producing in response thereto a first controlled output signal, said first electrical processing channel including a plurality of selectively interconnectable signal processing means at lesat one of which is capable of selectively amplifying with an module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics to the first controlled output signals; and a second electrical signal processing channel operatively coupled amplifying means for receiving said selectively amplified audio frequency electrical signals and for producing in response thereto a second controlled output signal, said second electrical processing channel including a plurality of selectively interconnectable signal processing means at least one of which is capable of at least one of selectively amplifying, distorting and adding preselected harmonic content to the first controlled output signals; and means including a preamplifier output terminal operatively coupled to said first and second electrical signal processing channels for selectively applying one of said first and second controlled output signals to said preamplifier output.

14. The preamplifier of claim 13 wherein said second electrical signal processing channel is electrically connected in parallel to said first electrical signal processing channel at the output of said selectively amplifying means and wherein said selectively applying means electrically connects one of said first and second electrical signal processing channels to said preamplifier output terminal.

15. The preamplifier of claim 14 wherein said selectively amplifying means is a relay means electrically connected to each of said first and second electrical signal processing means and said preamplifier output terminal and includes means responsive to a control signal to electrically switch between said first and second electrical signal processing channels for electrically disconnecting the electrical signal processing channel electrically connected to the preamplifier output terminal and for electrically connecting to the preamplifier output terminal the electrically disconnected electrical signal processing channel.

16. The preamplifier of claim 15 wherein selectively amplifying means comprises an electrical amplifying means adapted to selectively amplify audio frequency electrical signals in at least one of a linear mode and nonlinear mode.

17. A method of producing controlled output signals having selected distortion and harmonic content, from audio frequency electrical signals generated by a musical instrument comprising the steps of:

selectively amplifying the audio frequency electrical signals generated by said musical instrument;

receiving said selectively amplified audio frequency electrical signals with a first electrical processing channel including a plurality of selectively interconnectable signal processing means at least one of which is capable of selectively amplifying with a module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics to said plurality of output signals for producing a first controlled output signal; and concurrently receiving said selectively amplified audio frequency electrical signals with a second electrical processing channel including a plurality of selectively interconnectable signal processing means at least one of which is capable of at least one of selectively amplifying, distorting and adding preselected harmonic content for producing a second controlled output signal; and selectively applying in response to a contol signal one of said first and second controlled output signals to a preamplifier output terminal.

18. The method of claim 17 further comprising the step of:
   generating a control signal which is used to control the step of selectively applying the first and second controlled output signals to such preamplifier output terminal.

19. The method of claim 18, further comprising the step of:
   amplifying the controlled output signal applied to said preamplifier output terminal.

20. A preamplifier comprising:
   circuit means having a printed circuit board for defining electrically conducting paths formed in a predetermined pattern and which includes means for defining a first electrical signal processing channel capable of receiving a selectively amplified audio frequency electrical signal;
   a plurality of connecting means located on said printed circuit means and electrically operatively connected to said circuit means and said first electrical signal processing channel, said connecting means being adapted to receive pluggable signal processing modules which are removably inserted therein;
   at least two pluggable signal processing modules adapted to be inserted into one of said plurality of connecting means and being electrically connected to said first electrical signal processing channel including electronic means for selectively amplifying with a module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics to said plurality of output signals to produce a processed output signal; and
   means including an output terminal operatively coupled to said circuit means for receiving said processed output signal.

21. The preamplifier of claim 20 wherein said circuit means further includes means for defining a second electrical signal processing channel, having an output and wherein said means including an output terminal includes a switching means which is electrically connected between the outputs of said first and second electrical signal processing means and said output terminal wherein said switching means electrically connects the output from only one of the first and second electrical signal processing channels to said output terminal.

22. A preamplifier comprising:
   a housing including means defining a surface having an elongated opening formed therein;
   electronic circuit means including
   circuit means having a printed circuit means positioned within said housing and located below said elongated opening for defining electrically conducting paths formed in a predetermined pattern and first and second electrical signal processing channels each being capable of receiving a selectively amplified audio frequency electrical signal;
   a plurality of connecting means located on said printed circuit means and electrically operatively connected to said circuit means and said first and second electrical signal processing channels, said connecting means being adapted to receive pluggable signal processing modules which are removably inserted therein;
   at least two pluggable signal processing modules adapted to be passed through the elongated opening of said housing surface and inserted into one of said plurality of connecting means and being electrically connected to one of said first and second electrical signal processing channels, said at lesat two pluggable signal processing modules including electronic means for selectively amplifying with a module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics to the selectively amplified audio frequency electrical signal to produce first and second processed output signals; and
   means including an output terminal operatively coupled to said circuit means for selectively applying one of said first and second processed output signals to the preamplifier output terminal.

23. A preamplifier comprising:
   a housing including means defining a top surface having an elongated opening formed therein and a hollowed-out central area which communicates with said elongated opening, said housing including means defining a control panel having a plurality of openings therethrough which communicate with said hollowed-out central area;
   a printed circuit board located in said hollowed-out central cavity and positioned below and accessable through said elongated opening, said printed circuit board including
   an input stage;
   a first electrical signal processing channel including means for amplifying with a module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics an audio frequency electrical signal to produce an output signal;
   a second electrical signal processing channel including means for amplifying with a module having a frequency bandwidth of about 20 hertz to about 20 kilohertz producing a clean, low distortion output signal, distorting with a module having a frequency bandwidth of about 70 hertz to about 17 kilohertz producing an output signal having about 6 db of gain and some distortion and adding preselected harmonic content with a module having a frequency bandwidth of about 150 hertz to about 10 kilohertz producing an output signal having high distortion and hard overdrive characteristics an audio frequency electrical signal to produce an output signal;

a first electrical connector mounted on said printed circuit board and electrically connected to said input stage;

a second electrical connector mounted on said printed circuit board and electrically connected to the output of said first electrical signal processing channel;

a third electrical connector mounted on said printed circuit board and electrically connected to the output of said second electrical signal processing channel;

an output terminal;

a switch electrically connected between said output terminal and each of said first signal processing channel and said second electrical signal processing channel, said switch being operative for selectively applying electrical signals from one of said second and third electrical connectors to said output terminal; and external circuit adjustment controls extending from said printed circuit board through the plurality of said openings in the control panel of said housing.

24. The preamplifier of claim 23 further comprising a first pluggable module including an elongated electrical connecting member capable of being inserted into any one of said electrical connectors, said first pluggable module being capable of being passed through said elongated opening and positioned with said electrical connecting member positioned in mechanical engagement with any one of said electrical connectors and electrically connecting said first pluggable module with said printed circuit board, said first pluggable module including an electric circuit which is capable of at least one of selectively amplifying, distorting, and adding preselected harmonic content to electrical signals.

25. The preamplifier of claim 24 wherein said first pluggable module is capable of amplifying and is positioned in said first electrical connector for amplifying signals processed by said input stage and further comprising a second and third pluggable module, each of which includes an elongated electrical connecting member capable of being inserted into any one of said second and third electrical connectors, each of said second and third pluggable modules being capable of being passed through said elongated opening and positioned with its associated elongated electrical connecting member in mechanical engagement with said second electrical connector and said third electrical connector, each of said second and third pluggable modules including an electrical circuit which is capable of at least one of selectively amplifying, distorting, and adding preselected harmonic content to the signals processed by said first and second electrical signal processing channels.

* * * * *